United States Patent [19]

Barresi et al.

[11] Patent Number: 4,564,135

[45] Date of Patent: Jan. 14, 1986

[54] CHIP CARRIER SOLDERING TOOL

[75] Inventors: Anthony J. Barresi, Hammonton; Leonard Nelson, Cherry Hill, both of N.J.

[73] Assignee: RCA Corporation, Princeton, N.J.

[21] Appl. No.: 566,826

[22] Filed: Dec. 29, 1983

[51] Int. Cl.[4] .............................................. B23K 1/12
[52] U.S. Cl. .................................. 228/6.2; 228/180.2; 228/219; 228/242; 228/20
[58] Field of Search .............. 228/6 A, 180 A, 219, 228/222, 242, 240, 20; 219/373

[56] References Cited

U.S. PATENT DOCUMENTS

| | | | |
|---|---|---|---|
| 1,531,518 | 3/1925 | Simmons | 219/373 |
| 2,017,397 | 10/1935 | Esser | 228/219 |
| 3,328,556 | 6/1967 | Nelson et al. | 228/219 |
| 3,937,386 | 2/1976 | Hartleroad et al. | 228/6 A |
| 4,022,370 | 5/1977 | Durney | 228/6 A |
| 4,066,204 | 1/1978 | Wirbser et al. | 228/6 A |
| 4,218,604 | 8/1980 | Masaoka et al. | 228/222 |
| 4,295,596 | 10/1981 | Doten | 228/180 A |
| 4,373,658 | 2/1983 | March et al. | 228/242 |
| 4,426,571 | 1/1984 | Beck | 228/242 |

FOREIGN PATENT DOCUMENTS

| | | | |
|---|---|---|---|
| 0048937 | 4/1980 | Japan | 228/6 A |
| 0048938 | 4/1980 | Japan | 228/6 A |
| 0085037 | 6/1980 | Japan | 228/180 A |

OTHER PUBLICATIONS

AT&T Technical Digest, Hot Air Device . . . Colderwood, Sep. 1984, No. 75, p. 11.
IBM Technical Disclosure, Solder Reflow Tool, C. Trollman, 3-69, vol. 11, No. 10, p. 1298.
"Guide for Removal, Replacement of Surface Mounted Devices-Part 3", By: John B. Holdway; Feb. 1985 issue of Electronics, pp. 23-26.

*Primary Examiner*—Nicholas P. Godici
*Assistant Examiner*—Kurt Rowan
*Attorney, Agent, or Firm*—Joseph S. Tripoli; Robert L. Troike; Robert Ochis

[57] ABSTRACT

A toll for melting solder on the contacts of a surface mounted electronic component and on the corresponding contacts of a printed circuit substrate to which it is to be soldered or from which it is to be de-soldered. The tool includes a conduit for conducting hot gas to the contacts. A diverter located in the interior of the conduit deflects hot gas away from the top of the surface mounted component and confines the hot gas to the periphery of the component.

10 Claims, 6 Drawing Figures

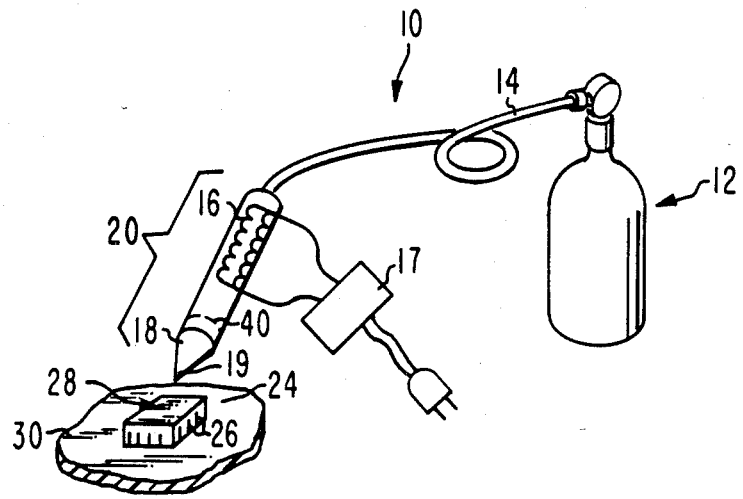
Fig. 1 PRIOR ART
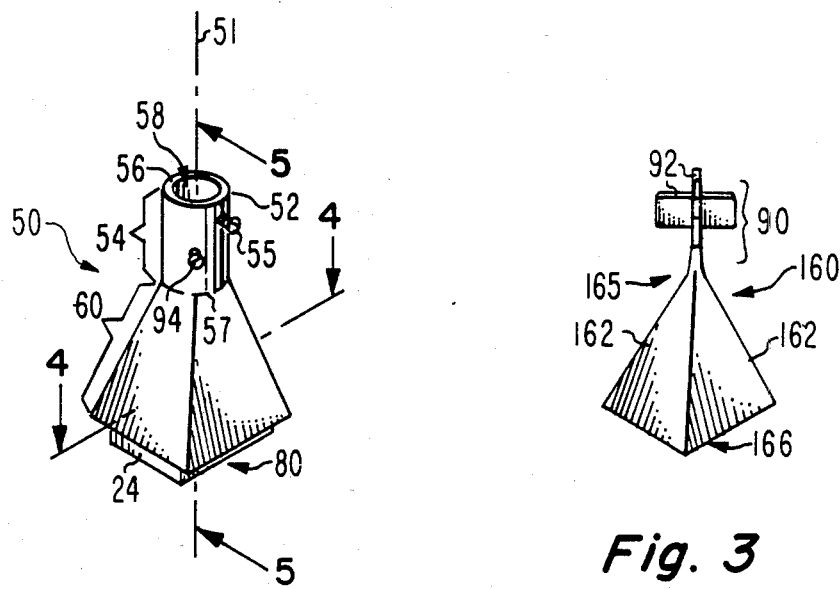
Fig. 2
Fig. 3

CHIP CARRIER SOLDERING TOOL

BACKGROUND OF THE INVENTION

The present invention relates to the field of surface mounted chip carriers and more particularly to tools for soldering such chip carriers to a substrate or de-soldering such chip carriers from a substrate to which they have been soldered.

Small (0.500 inch by 0.500 inch) surface mounted chip carriers may have as many as 40 contact pads thereon (10 per side) which must be soldered to mating contact pads on a printed circuit substrate. The printed circuit substrate may take any appropriate form such as a ceramic printed circuit substrate, a printed circuit board, a porcelain coated metal printed circuit board and so forth.

There are well developed techniques for simultaneously soldering a plurality of surface mounted chip carriers to a printed circuit substrate. Subsequent to such mass soldering of chip carriers to a printed circuit substrate the need sometimes arises to non-destructively remove one or more of the chip carriers. There are problems with present day techniques for such de-soldering of chip carriers from a printed circuit substrate.

When a chip carrier must be removed from a printed circuit substrate, the solder between all of its contact pads and the printed circuit substrate must be made molten at the same time. This requires a substantial amount of heat distributed around the periphery of the chip carrier. Application of too much heat in this process can damage the semiconductor chip mounted inside the chip carrier.

Conventional soldering equipment such as soldering irons is incapable of rendering all of the solder connections molten at the same time. One technique which is used for de-soldering chip carriers is to direct a jet of hot gas at the chip carrier to melt the solder. U.S. Pat. No. 4,295,596 to Doten et al. discloses a tool which includes a plurality of individual gas jets each directed at a different individual contact pad for de-soldering chip carriers. This tool has the disadvantage of being complicated and being limited by its gas jet configuration to a specific chip carrier package size and contact pad configuration.

There is a need for a simple tool for removing surface mounted components from printed circuit substrates without, during normal operation, damaging the components so mounted.

SUMMARY OF THE INVENTION

The present invention meets this need by providing an improved nozzle for a hot gas jet. This nozzle directs gas flowing there through at the interface between the chip carrier and the printed circuit substrate. In a preferred embodiment the nozzle is a conduit having an outlet end which conforms to a selected chip carrier shape and size. This nozzle provides a hollow stream of gas at its outlet orifice. The body of the chip carrier is shielded from this stream which is directed at the interface between the chip carrier contact pads and the printed circuit substrate contact pads to preferentially melt the bonding solder without significant risk of damaging components within the package. Means for lifting the de-soldered chip carrier from the printed circuit substrate may be included in the nozzle.

BRIEF DESCRIPTION OF THE DRAWINGS

FIG. 1 illustrates a PRIOR ART hot-gas soldermelting tool;

FIG. 2 illustrates a tool in accordance with the invention in perspective view;

FIG. 3 illustrates a part of the tool which is not visible in FIG. 2;

Figure 5:
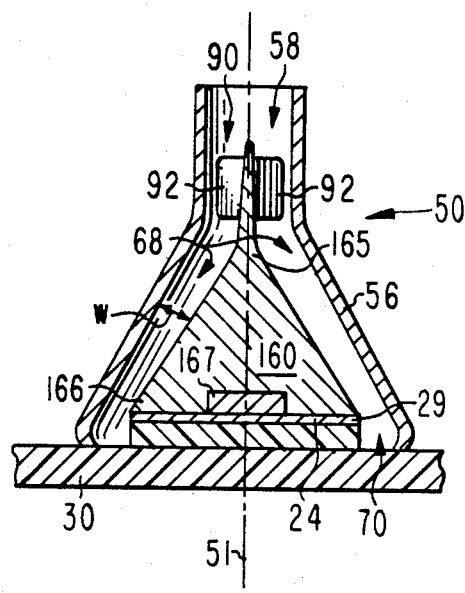
FIG. 5 illustrates the tool of FIG. 2 in a cross section taken along the line 5—5 in FIG. 2.

A prior art system for de-soldering surface mounted chip carriers which includes a source 12 of an inert gas, a tube or hose 14, and an applicator 20 is shown generally at 10 in FIG. 1. The inert gas, generally dry nitrogen, is used in order to avoid forming oxides at the high gas temperature. The tube 14 carries the inert gas from source 12 to applicator 20. Applicator 20 includes an electric heater 16 and a nozzle 18. The applicator has an outside diameter of about ½ inch (1.27 cm) and an outlet orifice inner diameter of about 3/32 inch (0.238 cm). The heater 16 is located in the gas flow path from source 12 to nozzle 18 and is designed to heat the gas to 371° C. at the maximum flow rate used. This maximum temperature may be changed by controlling the power input to the heater 16. Heater activation is controlled by a switch 17. Because of the reduced diameter of orifice 19, nozzle 18 increases the gas velocity at discharge over the velocity within the body of applicator 20.

A surface mounted chip carrier 24 is secured to the printed circuit substrate 30 by solder between each of its contact pads 26 and the mating contact pad on the printed circuit substrate 30. To melt the solder along all edges of a surface mounted chip carrier 24 which is to be de-soldered from a printed circuit substrate 30, the gas jet which emerges from applicator 20 at 700° F. (371° C.) is directed generally at the chip carrier. This high temperature gas melts the solder in a few seconds. However, such a jet by its nature primarily strikes the body of the chip carrier. This heats the surface mounted chip carrier and the component(s) mounted therein to high temperatures. These high temperatures may be beyond the temperature tolerance of the components mounted within that chip carrier. If that is the case, then those components will deteriorate and immediately or eventually fail.

DETAILED DESCRIPTION OF THE PREFERRED EMBODIMENT

The present invention is an improved nozzle configuration for this type of soldering tool which overcomes the problem of heating the whole chip carrier. A preferred embodiment is shown generally at 50 in FIG. 2.

Nozzle 50 is a conduit for receiving a stream of gas at an inlet end 52 and conducting it to a chip carrier at an outlet end 80 in a manner to shield the bulk of the chip carrier's body from the gas and to concentrate the gas flow on the soldered-contact interface. Nozzle 50 is a single flared tube having an input portion 54 in the form of a right circular cylindrical shell which extends from inlet end 52 to an outlet portion 60. Outlet portion 60 extends from an end 57 of the inlet portion 54 to outlet end 80. Outlet portion 60 is a four-sided, pyramidally flared, portion of the conduit and provides the gas stream with a desired discharge configuration in a manner which is discussed later.

Nozzle 50 is configured to be connected to an applicator of the type shown in FIG. 1 after removal of the applicator's nozzle 18 at cut line 40. A press fit or a set screw 55 secures inlet portion 54 of nozzle 50 to the truncated applicator 20 of FIG. 1. In this configuration the nozzle preferably to an annealled brass tube having an overall length of 3 inch (7.62 cm) and an inlet portion 54 inner diameter of ½ inch (1.27 cm). Thus, the nozzle 50 is easily attached to or removed from an applicator 20 when a chip carrier of a different configuration or size is to be soldered or de-soldered.

The gas stream configuration provided by nozzle 50 is a hollow rectangular tubular stream of gas which exposes the contact pads to hot gas while shielding the bulk of the chip carrier's body from the hot gas. This gas configuration is generated by flared outlet portion 60 which includes a four-sided solid brass pyramidal member 160 within it which diverts the flow from the central or axial part of outlet portion 60. The shape of the cross section of the flared portion 60 of nozzle 50 is selected to match the shape and size of the chip carriers with which it is to be used. Thus, it will generally be rectangular and usually will be square.

Figure 4:
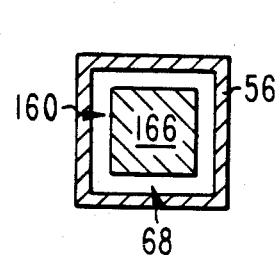
FIG. 4 is a cross-section through the tool of FIG. 2 along the line 4—4.

Member 160 is shown in perspective in FIG. 3 and has four lateral surfaces 162, a tip 165 and a base 166. Lateral faces 162 are shown as being substantially planar, but may curve from the tip 165 to the base 166, if desired. Member 160 is spaced from the interior surface of the lateral walls 56 of flared portion 60 to form a fluid channel 68 which is shown in FIGS. 4 and 5. In operation gas entering the flared portion 60 from the inlet portion 54 is diverted away from the axis 51 of the nozzle by member 160 and flows along all lateral surfaces of member 160. This converts the solid-cross-section flow within inlet portion 54 into a hollow tubular-cross-section flow having a cross section which is the same general shape (rectangular) as flared portion 60.

Figure 6:
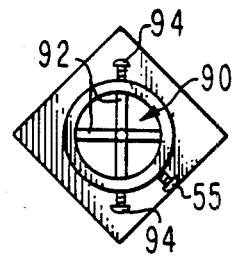
FIG. 6 is a top view of the inlet end of the tool.

A four-winged butterfly like member 90 which extends from tip 165 of member 160 into inlet portion 54 supports member 160 in nozzle 50. The butterfly-like member 90 is made of brass and is secured in inlet portion 54 by a pair of brass set screws 94 (FIG. 6) which extend through the nozzle's lateral wall 56 into contact with two of the wings 92 which are coplanar.

The flared portion of nozzle 50 has a generally rectangular cross section along planes which are parallel to the plane of the cross section taken along line 4—4 in FIG. 2 and shown in FIG. 4. In FIG. 4 the square annular space bounded by member 160 and the lateral walls of nozzle 50 is the fluid channel 68 which extends from the tip 165 of member 160 to the base 166 of member 160 where an outlet orifice 70 between the base 166 of member 160 and conduit wall 56 comprises the end of fluid channel 68. This orifice has a width of 1/16 inch (0.1588 cm). Member 160 is positioned symmetrically with respect to the lateral walls 56 of outlet portion 60 to give the orifice 70 a substantially uniform cross section parallel to the plane of FIG. 4. The width of fluid channel 68 may taper from the middle of any side 162 to the corners of that side to provide different desired gas flow rates at different portions of the outlet orifice 70. Fluid channel 68 may be provided with other contours as is appropriate for the particular conditions under which the nozzle is designed to be used.

Member 160 may be referred to as a diverter or converter since it forces any gas flowing from inlet portion 54 into outlet portion 60 to diverge from the axis 51 of nozzle 50. This diversion converts the initially cylindrical flow in fluid channel 58 in inlet portion 54 into a hollow tubular flow in the form of a pyramidal shell in channel 68.

Referring now to the cross section in FIG. 5 it is seen that the cross sections of outlet portion 60 and member 160 both increase in size with increasing distance from inlet portion 54. The width W (FIG. 4) of the fluid channel 68 decreases from tip 165 to base 166 of member 160. This width reduction is coordinated with the increase in size of the interior perimeter of fluid channel 68 from tip 165 to base 166 in a manner to provide fluid channel 68 with a substantially constant cross sectional area. This constant area results in a substantially uniform gas flow velocity throughout the length of nozzle 50.

If desired, outlet portion 60 may include a non-flared portion following its flared portion. However, as illustrated in FIG. 5 the lateral walls 56 at the outlet end 80 are preferably curved inward to aid in directing the flowing gas which emerges from the fluid channel 68 through orifice 70 toward the solder which bonds or will bond the chip carrier 24 to the printed circuit substrate 30.

The base of member 160 is preferably the same size as the top of the chip carriers with which the nozzle is to be used. Placement of the nozzle 50 over such a chip carrier positions member 160 so that its base 166 contacts the top of the chip carrier and prevents the hot gas emerging from orifice 70 from flowing directly against the top 28 of the surface mounted chip carrier 24. Under normal conditions this is effective to ensure that the components within the chip carrier are not damaged during the removal or installation process.

Member 160 preferably includes a source of a magnetic field in its base portion. This source may preferably be a permanent magnet 167 shown in FIG. 5. This magnet will attract any chip carrier which contains sufficient ferromagnetic material, i.e. material which can be attracted by a magnet. Ceramic chip carriers are generally sealed with steel covers 29 which contain enough ferromagnetic material to enable the chip carries to be picked up by magnet 167 once the solder is in molten form. Alternatively, a vacuum pick-up may be added to member 160 to enable it to pick-up non-magnetic chip carriers when the nozzle is lifted from the printed circuit substrate.

In preparation for removing a surface mounted chip carrier 24 from the printed circuit substrate 30, a nozzle 50 which is configured for use with that type of chip carrier is attached to the truncated applicator 20. The chip carrier is removed in the following manner. First, the nozzle is positioned with its outlet end over the surface mounted chip carrier 24. Second, gas flow is intiated. Third, heater 16 is activated by switch 17 to heat the flowing gas to solder melting temperatures. Fourth, once the hot gas has melted the solder which bonds the chip carrier 24 to printed circuit substrate 30, the nozzle 50 is lifted away from the printed circuit substrate 30. If the surface mounted chip carrier being removed has a ferromagnetic material top, then lifting the nozzle 50, equipped with permanent magnet 167, lifts the chip carrier. If the chip carrier does not contain enough ferromagnetic material to enable it to be lifted off the printed circuit substrate by nozzle 50, then the chip carrier is removed while the solder is still in molten form by grasping the chip carrier with tweezers or by holding the printed circuit substrate upside down or on edge and tapping the printed circuit substrate with sufficient force to dislodge the chip carrier.

Nozzle 50 may also be used for soldering down a chip carrier onto a printed circuit substrate. This is done by placing the chip carrier in the desired position; placing a nozzle, which will not attract the chip carrier, over the chip carrier; and turning on the hot gas to melt the solder which has been tinned, plated, or otherwise deposited onto both sets of contact pads. The heat, but not the gas, may then be turned off and the flowing gas will cool the bonding solder until it solidifies. The nozzle 50 may then be removed. In the alternative, the nozzle 50 may be removed before the solder solidifies. The solder is then permitted to cool and solidify in the ambient atmosphere.

What is claimed is:

1. A tool for use with surface mounted chip carriers, comprising:
   a conduit, having a lateral wall, an inlet end, and an outlet end, for conducting hot gas and including a flared portion in which the interior cross sectional area of said conduit increases with increasing distance from said inlet end; and
   an inner member disposed within said conduit, extending from said outlet end toward said inlet end and spaced from said lateral wall in the vicinity of said outlet end, said inner member and said lateral wall together defining an annular gas outlet orifice at said outlet end for converting a flow of gas having a solid cross section at said inlet end into a flow having a hollow tubular cross section at said outlet end.

2. The tool recited in claim 1 wherein:
   said conduit includes an inlet portion disposed between said inlet end and said flared portion.

3. The tool recited in claim 2 wherein:
   said inlet portion is a right circular cylindrical shell; and
   said conduit has a substantially straight central axis extending from said inlet end to said outlet end.

4. A tool for use with surface mounted chip carriers, comprising:
   a conduit, having lateral walls, an inlet end, an outlet end, and a flared portion in which the interior cross-section of said conduit increases with increasing distance from said inlet end, a section of said flared portion of said conduit having a four-sided pyramidal shape; and
   means within said conduit for converting a flow of gas having a solid cross-section at said inlet end into a flow having a hollow tubular cross section, said converting means being a substantially solid member having a four-sided pyramid shape.

5. The tool recited in claim 4 wherein:
   said conduit comprises a one-piece flared tube.

6. Apparatus for use with surface mounted chip carriers, comprising:
   a conduit, having lateral walls, an inlet end, an outlet end, and a flared portion in which the interior cross section of said conduit increases with increasing distance from said inlet end toward said outlet end, for conducting hot gas;
   a diverter device within said flared portion, said diverter device having a main portion whose cross section increases with increasing distance from said inlet end toward said outlet end of said conduit;
   said diverter device being positioned within said flared portion to divert said flow from the central portion of said conduit and to leave a channel for gas flow surrounding said diverter within said flared portion.

7. The apparatus recited in claim 6 wherein:
   said conduit includes an inlet portion disposed between said inlet end and said flared portion.

8. The apparatus recited in claim 7 further comprising:
   means for coupling and supporting said diverter to said lateral walls of said conduit.

9. The apparatus recited in claim 8 wherein:
   said coupling and support means extends into said inlet portion and is secured to said lateral walls therein.

10. The apparatus recited in claim 7 wherein:
    said inlet portion is in the form of a right circular cylindrical shell.

* * * * *